United States Patent
Funabashi et al.

(10) Patent No.: US 7,453,100 B2
(45) Date of Patent: Nov. 18, 2008

(54) DFB LASER ASSEMBLY AND LASER MODULE

(75) Inventors: Masaki Funabashi, Tokyo (JP); Ryosuke Yatsu, Tokyo (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 1179 days.

(21) Appl. No.: 10/228,136

(22) Filed: Aug. 27, 2002

(65) Prior Publication Data
US 2003/0063648 A1 Apr. 3, 2003

(30) Foreign Application Priority Data
Aug. 28, 2001 (JP) ............................. 2001-257473
Feb. 26, 2002 (JP) ............................. 2002-049027

(51) Int. Cl.
*H01L 33/00* (2006.01)
(52) U.S. Cl. .......................................... 257/99; 257/94
(58) Field of Classification Search .................. 257/84, 257/86, 94, 98, 99; 372/43.01, 44.01, 45.011
See application file for complete search history.

(56) References Cited
U.S. PATENT DOCUMENTS

| | | | | |
|---|---|---|---|---|
| 4,199,888 A | * | 4/1980 | Barnes | 43/42.33 |
| 4,360,965 A | | 11/1982 | Fujiwara | |
| 4,942,689 A | * | 7/1990 | Link et al. | 43/42.24 |
| 5,537,775 A | * | 7/1996 | Crumrine | 43/42.38 |
| 5,588,248 A | * | 12/1996 | Cornell et al. | 43/44.9 |
| 5,786,416 A | * | 7/1998 | Gardner et al. | 524/440 |
| 5,953,848 A | * | 9/1999 | Darnell et al. | 43/42.19 |
| 6,252,726 B1 | | 6/2001 | Verdiell | |
| 6,472,691 B2 | * | 10/2002 | Mukaihara et al. | 257/115 |
| 6,497,069 B1 | * | 12/2002 | Acworth et al. | 43/44.9 |

FOREIGN PATENT DOCUMENTS

| | | |
|---|---|---|
| EP | 0 920 095 | 6/1999 |
| EP | 1 089 407 | 4/2001 |

OTHER PUBLICATIONS

R. Menna, et al., Conference on Lasers and Electro-Optics, pp. xxiii-xxiv, XP-002220637, "High Power 1550 nm Distributed Feedback Lasers With 440 mW CW Output Power for Telecommunication Applications", 2001.

(Continued)

*Primary Examiner*—Kevin M Picardat
(74) *Attorney, Agent, or Firm*—Oblon, Spivak, McClelland, Maier & Neustadt, P.C.

(57) ABSTRACT

A DFB laser assembly including both a DFB laser device, with a buried heterostructure having a cavity length of 400 µm, a differential resistance of 4Ω, an emission wavelength of 1550 nm, and a thermal resistance of 50K/watt or less, and a heat sink mounting the DFB laser device in a junction-down structure so that the DFB laser device has a wavelength/current coefficient at 5 picometers/milli-ampere or less.

40 Claims, 5 Drawing Sheets

OTHER PUBLICATIONS

R. U. Martinelli, et al., IEEE Photonics Technology Letters, vol. 6, No. 12, pp. 1415-1417, XP-000486220, "1.95 μm Strained InGaAs-InGaAsP-InP Distributed—Feedback Quantum—Well Lasers", Dec. 1994.

T. R. Chen, et al., Proceedings of the 1996 Conference on Lasers and Electro-Optics, pp. 336-337, XP-002220638, "DFB Laser With 95 mW Output at 1.55 μm", 1996.

W. B. Joyce, et al., Journal of Applied Physics, vol. 46, No. 2, pp. 855-862, XP-002008082, Thermal Resistance of Heterostructure Lasers, Feb. 1, 1975.

A. G. Steventon, et al., IEEE Journal of Quantum Electronics, pp. 602-610, XP-000705541, CW Operation of GaInAsP Stripe Lasers, May 1, 1981.

J. G. Simmons, et al., Optoelectonics and Microelectronics Material Devices, pp. 120-123, XP-010350051, "Series Resistance and its Effect on the Maximum Output Power of 1.5 μm Strained-Layer Multiple-Quantum-Well Ridge Waveguide InGaAsP Lasers", Dec. 14, 1998.

* cited by examiner

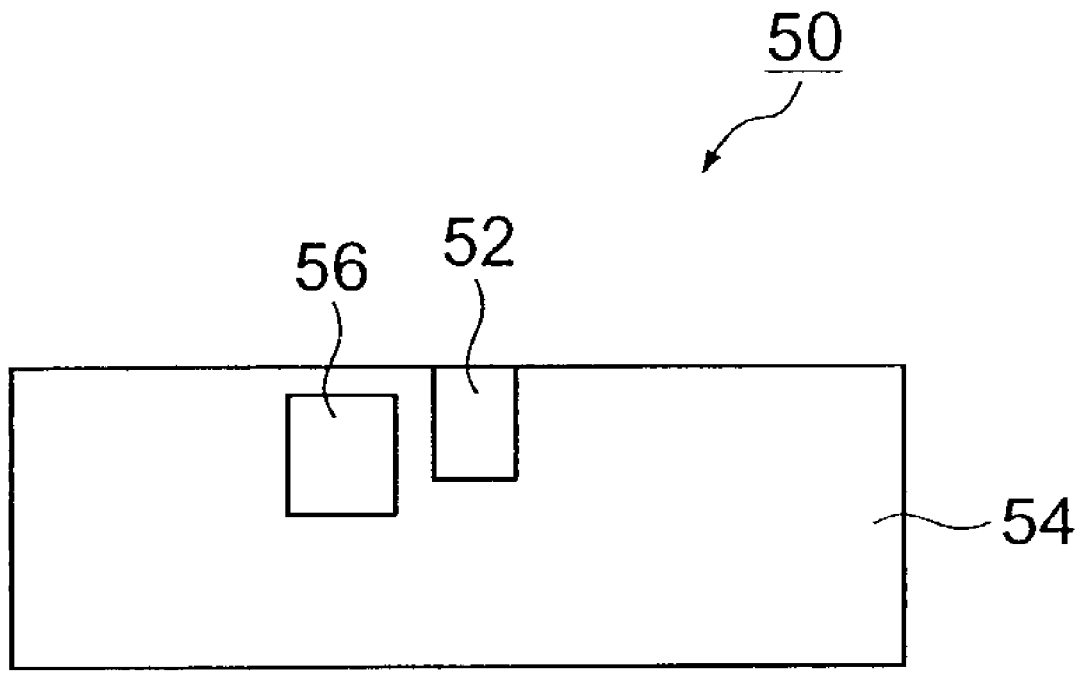

DFB LASER ASSEMBLY AND LASER MODULE

BACKGROUND OF THE INVENTION

1. Field of the Invention

The present invention relates to a distributed feedback semiconductor laser assembly (DFB laser assembly) including a DFB laser device and a heat sink onto which the DFB laser device is bonded. More specifically, the present invention relates to a DFB laser assembly having a high degree of wavelength stability, having a smaller range of variation in the emission wavelength with respect to a change in the operating current, and is thus suited to act as a light source for use in an optical communications system. The present invention also relates to a DFB laser module having such a DFB laser assembly.

2. Description of the Related Art

Typically a DFB laser device has in its resonant cavity a diffraction grating for periodically changing the real part and/or the imaginary part of the refractive index (complex refractive index) in the resonant cavity so that only laser light having a specific wavelength is fed-back to the resonant cavity for wavelength selectivity. Such a DFB laser device diffraction grating has a plurality of stripe layers disposed adjacent to the active layer. The stripe layers may be periodically arranged and may have a refractive index different from the refractive index of the adjacent layer in the resonant cavity. This configuration allows the DFB laser device to select an emission wavelength $\lambda_{DFB}$ independently of the optical gain peak wavelength of the active layer. The emission wavelength $\lambda_{DFB}$ has a relationship $\lambda_{DFB} = 2 \cdot n_{eff} \cdot \Lambda$ between the space period $\Lambda$ of the diffraction grating and the effective refractive index $n_{eff}$ of the optical waveguide.

Having such a wavelength selectivity, a typical DFB laser device is considered to be a promising light source for use in a long-distance optical communications system. For example, such a DFB laser device incorporated in a butterfly type DFB laser module is commonly used as a light source in the long-distance optical communications system. In FIG. 1, which shows the configuration of a typical butterfly type DFB laser module in a sectional view thereof, the DFB laser module 60 is configured to have 14 pins and emits a laser beam via an optical fiber 68. The DFB laser module 60 includes a DFB laser device 52, a heat sink 54, and a thermistor 56. The DFB laser device 52 is bonded onto the heat sink 54 made of aluminum nitride (AlN), which is supported on a base 72 and acts to dissipate the heat energy generated in the DFB laser device 52. The thermistor 56 is also provided on the heat sink 54 and serves to measure the operating temperature of the DFB laser device 52.

The DFB laser module 60 is generally driven to generate a constant optical output power in an APC (Auto Power Control) mode when employed as a light source in an optical communications system. Accordingly, there is provided a monitor photodiode 71 for detecting the optical output power from the DFB laser device 52 and for delivering a control signal to generate a constant optical output power. The monitor photodiode 71 is disposed on the DFB laser side in a monitor photodiode block 70, which is provided on the base 72.

In a practical configuration, there is provided an external feedback circuit (not shown) for adjusting the current $I_m$ delivered from the monitor photodiode 71 at a constant value in order to control a drive current and thereby emit a laser beam at a constant optical output power.

There are interposed a first lens 62, an optical isolator 64, and a second lens 66 between the DFB laser device 52 and the optical fiber 68. The first lens 62 is a collimator lens which collimates the laser beam emitted from the DFB laser device 52 to allow the resulting beam to impinge upon the optical isolator 64. The optical isolator 64 is an optical component which prevents the reflected beam from entering through the optical fiber 68 and transmits only the laser beam incident from the first lens 62 toward the second lens 66. The second lens 66 collects the laser beam incident from the optical isolator 64 and then transmits the resulting beam toward the optical fiber 68.

There is provided a Peltier element 74 beneath the base 72 to cool down or heat up the base 72. The Peltier element 74 cools down or heats up the DFB laser device 52 via the base 72 and the heat sink 54 to maintain the operating temperature of the DFB laser device 52, which is measured by the thermistor 56, at a predetermined temperature. These components including the DFB laser device 52 are received in a package 76, where a laser beam emitted from the DFB laser device 52 advances through the first lens 62, the optical isolator 64, and the second lens 66 into the optical fiber 68, which is inserted through the side-wall of the package 76, and then propagates outwardly therethrough.

The DFB laser module 60 described above and incorporating therein the DFB laser device 52 is widely used as a signal light source in an optical communications system employing the wavelength division multiplexing scheme (or a WDM system) which enables a large-capacity transmission. To transmit wavelength multiplexed signals via an optical fiber that are superimposed on multiple laser beams having different wavelengths, the WDM system requires semiconductor laser devices employed as the light sources, typically DFB laser devices, to provide the strict accuracy of the emission wavelengths and thus a high degree of stability of the emission wavelengths for a long period of time.

The tolerance of the wavelength accuracy and emission wavelength stability depend on the scale of the WDM system and the wavelengths of the laser beams of the light sources. In general, a narrower step frequency or spacing between the adjacent frequencies of the DFB laser devices requires a smaller tolerance. Approximately, the wavelength accuracy and emission wavelength stability are desired to be less than ±0.2 nm for a 100 GHz spacing (at a wavelength interval of up to 0.8 nm) and about ±0.1 nm for a 50 GHz spacing (at a wavelength interval of up to 0.4 nm).

In general, long-term operation of a semiconductor laser device results in degradation of laser properties. Specifically, the lasing efficiency of the laser device may gradually degrade or the threshold current of the laser device may increase more or less after a long-term operation. In a DFB laser device driven in an automatic power control (APC) mode, a degradation in the lasing efficiency or an increase in the threshold current of the DFB laser device causes the feedback loop to increase the drive current in order to maintain the optical output power at a constant. However, such a change in the drive current causes the emission wavelength to vary significantly, thereby making it difficult to maintain the wavelength accuracy and stability required by the WDM system. Accordingly, as discovered by the present inventors, there is a need for a DFB laser device which provides a reduced range of variation in the emission wavelength thereof with respect to a change in the operating current, thereby providing a high degree of stability in the emission wavelength.

SUMMARY OF THE INVENTION

It is therefore an object of the present invention to provide a DFB laser assembly including a DFB laser device having a small range of variation in the emission wavelength with respect to a change in the operating current thereof and thus having a higher wavelength stability.

The present invention provides, in a first aspect thereof, a distributed feedback semiconductor laser assembly (DFB laser assembly) including a DFB laser device and a heat sink mounting thereon the DFB laser device, wherein a ratio of a variation in an emission wavelength of the DFB laser device to a variation in an injection current of the DFB laser device is 5 pm/mA or less, 4 pm/mA or less, 3 pm/mA or less, or 2 pm/mA or less.

The present invention also provides, in a second aspect thereof, a DFB laser module including the DFB laser assembly as described above.

In accordance with the DFB laser assembly and the DFB laser module of the present invention, the smaller emission wavelength/injection current coefficient suppresses the range of variation in the emission wavelength of the DFB laser device, whereby the DFB laser device as a higher wavelength stability after a long-term operation or a higher output power operation.

The above and other objects, features and advantages of the present invention will be more apparent from the following description, referring to the accompanying drawings.

BRIEF DESCRIPTION OF THE DRAWINGS

FIG. 6 is a top plan view illustrating the configuration of a DFB laser assembly according to an embodiment of the present invention.

DETAILED DESCRIPTION OF THE PREFERRED EMBODIMENTS

Figure 1:
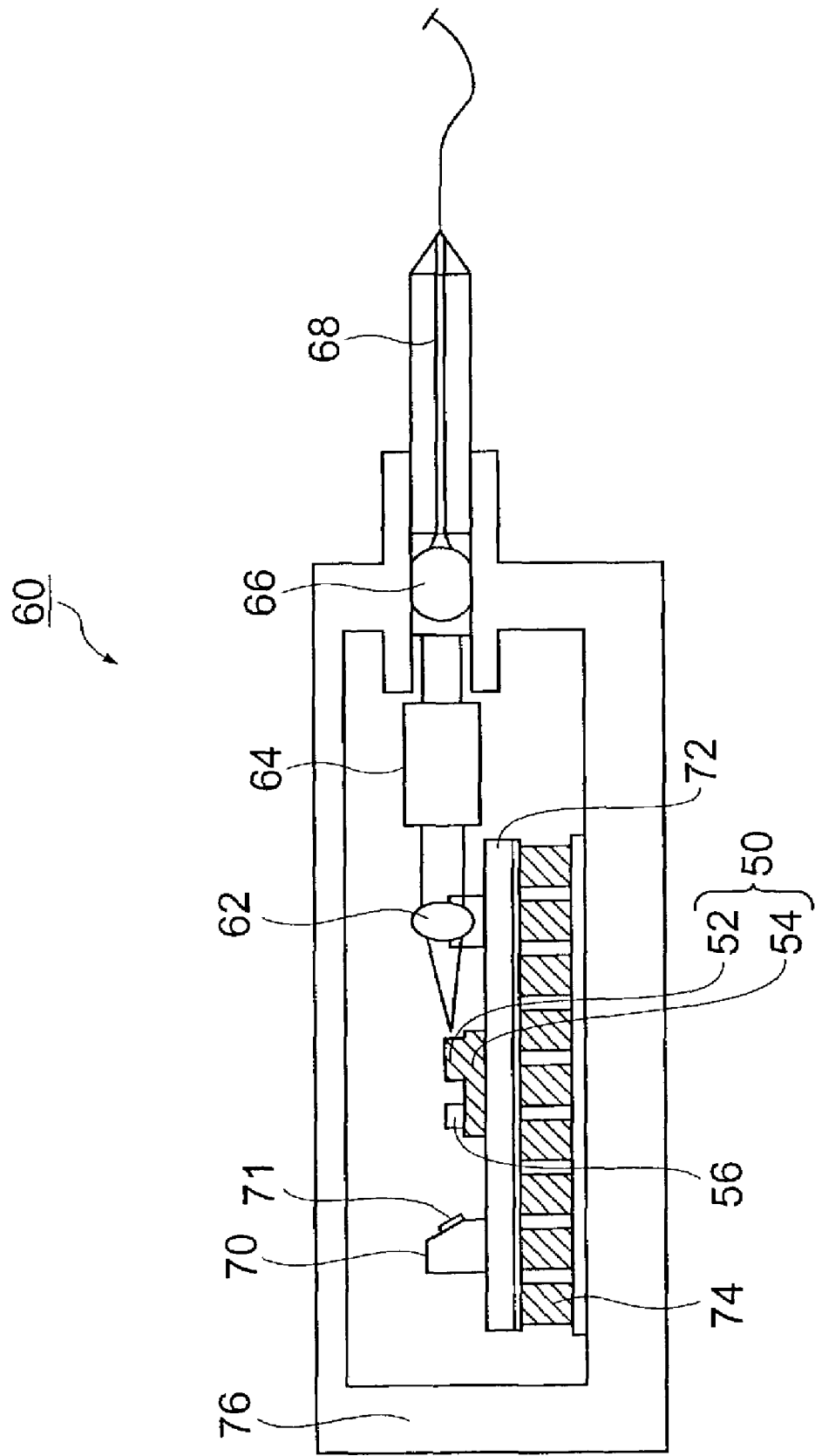
FIG. 1 is a sectional view illustrating the configuration of a butterfly-type DFB laser module for use in an optical communications system.

Before describing preferred embodiments of the present invention, the principle of the present invention will be described for a better understanding of the present invention.

In this text, the term "DFB laser assembly" as used hereinafter includes at least a DFB laser device and a heat sink. The term "DFB laser module" as used hereinafter has the DFB laser assembly and an optical system for optically coupling the DFB laser assembly to an optical fiber.

In the course of studies to address the problems described above, the inventor recognized that a variation in the emission wavelength associated with a change in the injection current (or operating current) is due to the fact that changes in the injection current cause a change in the heat generated in the DFB laser device and, therefore, the temperature of the active layer. More specifically, an increase in temperature increases the effective refractive index $n_{eff}$ in the resonant cavity of the DFB laser device, which causes a change in wavelength output, based on this assumption, the inventor conducted experiments and analyses and eventually reached the following findings.

That is, the inventor analyzed the dependency of the emission wavelength on the injection current to find that the dependency of the emission wavelength $\lambda$ on the injection current can be expressed by the following equation.

$$\lambda = \lambda_0 + \frac{\Delta\lambda}{\Delta T_{LD}} R_{th}(V_f I_f - P_0) \quad [1]$$

$$\approx \lambda_0 + \frac{\Delta\lambda}{\Delta T_{LD}} R_{th}[\{V_{th} + R(I_f - I_{th})\}I_f - P_0]$$

where $I_f$ is the injection current to the DFB laser, $\lambda_o$ is an imaginary emission wavelength at $I_f=0$, $\Delta\lambda/\Delta T_{LD}$ is the emission wavelength/temperature coefficient, which determines the temperature dependency of the emission wavelength, $V_f$ is the forward-bias voltage of the DFB laser, $V_{th}$ is the forward threshold voltage of the DFB laser, $I_{th}$ is the threshold current of the DFB laser device, $R_{th}$ is the thermal resistance of the DFB laser device being bonded onto the heat sink, R is the differential resistance of the DFB laser device, and $P_0$ is the optical output power from the DFB laser device.

In the foregoing equation, the second term on the right side, or $(\Delta\lambda/\Delta T_{LD})R_{th}[\{V_{th}+R(I_f-I_{th})\}I_f-P_0]$, represents the emission wavelength dependency of the current. In addition, the $(\Delta\lambda/\Delta T_{LD})$ and $V_{th}$ in the second term on the right side of the formula corresponds to the semiconductor materials that constitute the DFB laser device and are therefore constant relative to the emission wavelength dependency on the current. Accordingly, the present inventor recognized that the thermal resistance $R_{th}$ and the differential resistance R are responsible for the reduction in the emission current dependency of the emission wavelength, and therefore may be reduced to reduce the current dependency of the emission wavelength in the DFB laser device. The thermal resistance $R_{th}$ is defined as the ratio of an increase in temperature of the active layer to the power injected into the semiconductor laser and then converted into heat. The differential resistance R is defined as the resistance obtained by differentiating the voltage V with respect to the current I in the V-I characteristics of the DFB laser device.

As the parameters of the DFB laser assembly that seriously affect the thermal resistance and the differential resistance, the inventor focused attention on the cavity length of the DFB laser device that defines the contact area between the DFB laser device and the heat sink, and the structure for bonding the DFB laser device onto the heat sink and defining the thermal contact resistance. With regard to the structure for bonding, the term "junction-up" means bonding the n-side electrode 32 of the DFB laser device 10 onto the heat sink 54 with the p-side electrode 30 thereof being directed upward, while the term "junction-down" means bonding the p-side electrode 30 of the DFB laser device 10 onto the heat sink 54 with the n-side electrode 32 thereof being directed upward.

Figure 2:
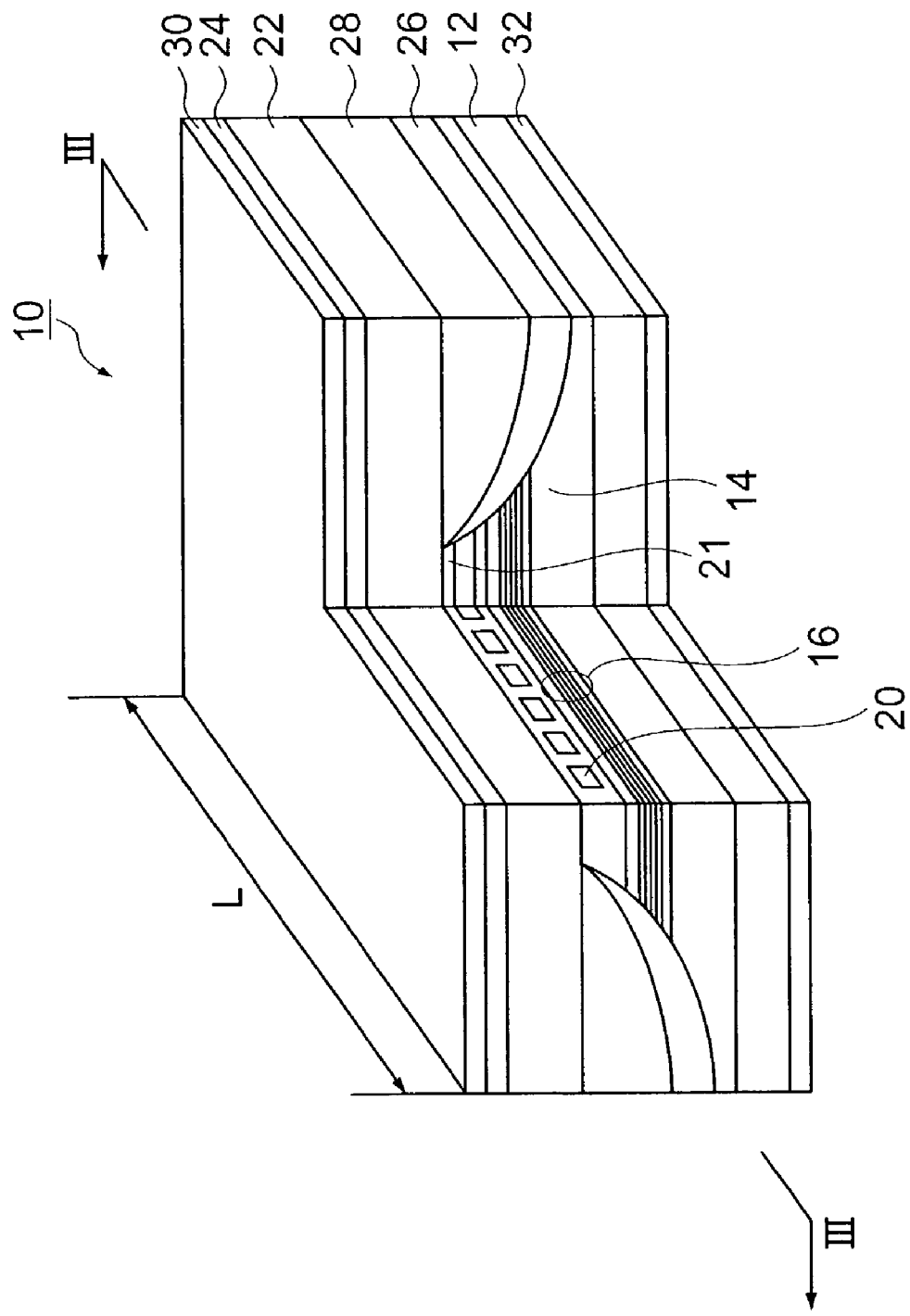
FIG. 2 is a partially cutout perspective view illustrating the configuration of a DFB laser device used as a sample of experiments 1 and 2 according to an embodiment of the present invention.
Figure 3:
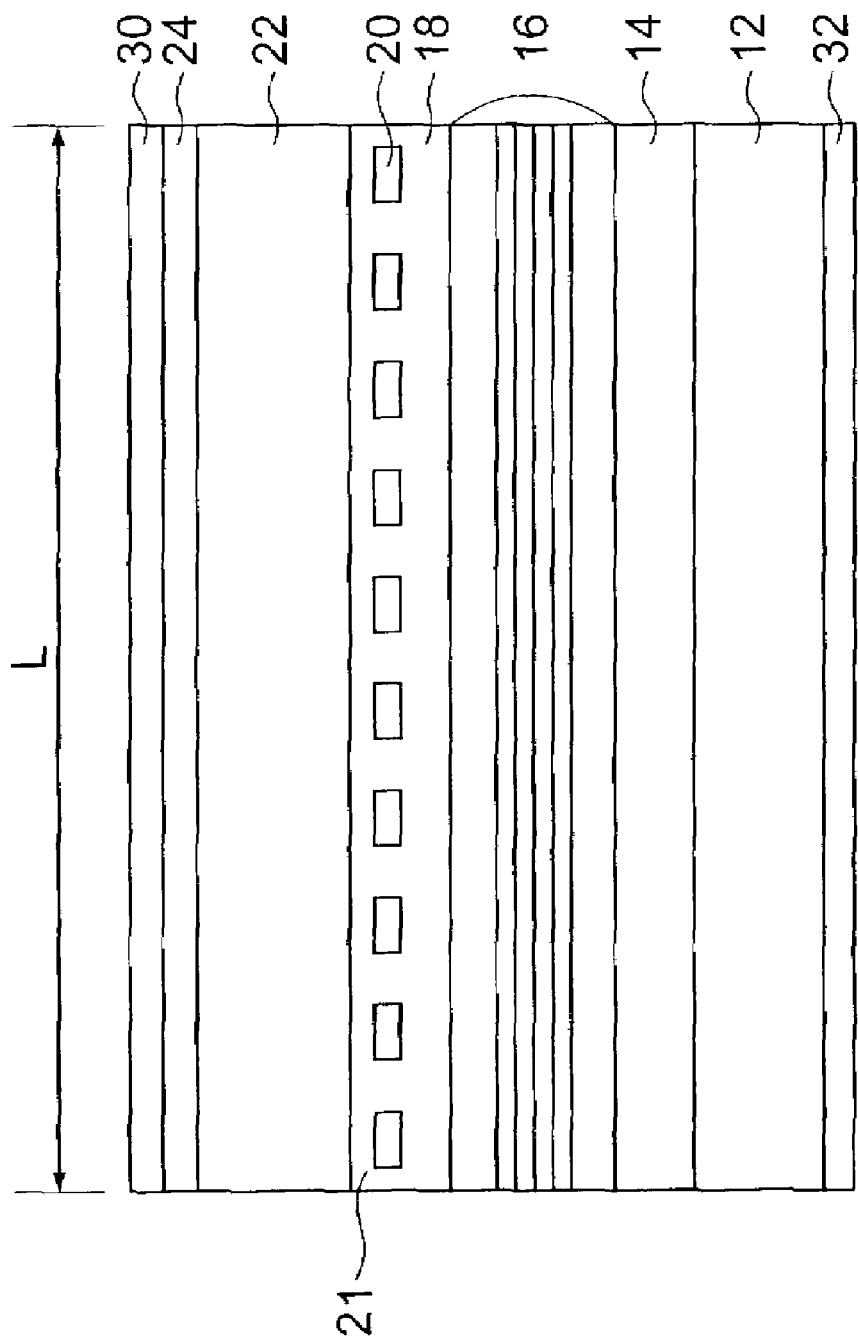
FIG. 3 is a sectional view of the DFB laser device of FIG. 2 as viewed in the direction of arrows III-III in FIG. 2.

Realizing the importance of bonding method and cavity length to minimizing current induced wavelength changes in the laser device, the inventor conducted several experiments using various methods of bonding the DFB laser device onto the heat sink with the cavity length of the DFB laser device being varied. With reference to FIGS. 2 and 3, there is shown a configuration of a DFB laser device which was used as a sample of the experiments.

The DFB laser device 10 is a buried heterostructure DFB laser device having an emission wavelength of approximately 1550 nm. As shown in FIG. 2 and FIG. 3, the DFB laser device 10 has an n-InP substrate 12 on which a layer structure is formed, the layer structure including an n-InP buffer layer 14, a MQW-SCH layer 16, a p-InP spacer layer 18, a diffraction grating 20 having a space period of about 240 nm, and a p-InP embedding layer 21 for embedding the diffraction grating 20.

The p-InP spacer layer 18 receiving therein the diffraction grating 20, the MQW-SCH layer 16, and an upper portion of the n-InP buffer layer 14 are configured to form a mesa stripe. On both sides of the mesa stripe, a p-InP layer 26 and an n-InP layer 28 are provided to form a current blocking p-n junction structure. The mesa stripe is about 1.5 μm wide at the depth of the MQW-SCH layer 16.

On top of the p-InP embedding layer 21 and the n-InP layer 28 on both the sides thereof, an about-2 μm-thick p-InP cladding layer 22 and a heavily doped GaInAs contact layer 24 are consecutively deposited. A Ti/Pt/Au multilayer metal film is formed as a p-side electrode 30 on top of the doped GaInAs contact layer 24, whereas an AuGeNi film is formed as an n-side electrode 32 on the bottom surface of the n-InP substrate 12. Moreover, the emitting face of the laser device is coated with an anti-reflection coat having a reflectivity of about 1%, whereas the rear face of the laser device is coated with a high-reflection coat having a reflectivity of about 90%. The reflectivity of the emitting face may be reduced about 3% or less, thereby making it possible to prevent the Fabry-Perot lasing mode at the peak wavelength of the optical gain distribution in the active layer. In addition, this may be combined with the rear face having a high reflectivity of 80% or more, thereby making it possible to increase the output efficiency from the emitting face.

To fabricate the DFB laser device 10, the layer structure including the n-InP buffer layer 14, the MQW-SCH layer 16, the p-InP spacer layer 18, and a diffraction grating layer are first epitaxially grown on the n-InP substrate 12 at a growth temperature of 600° C. using a MOCVD system. The diffraction grating layer is then coated with an electron beam (EB) resistance film in a thickness of about 100 nm. A diffraction grating pattern having a space period of about 240 nm is formed on this film using an EB lithography system. Subsequently, by a dry etching system using the resist pattern as a mask, the diffraction grating layer is selectively etched to form the diffraction grating 20.

Thereafter, by using a MOCVD system, the p-InP embedding layer 21 is grown on the diffraction grating 20 so as to embed the diffraction grating 20. A SiNx film is then deposited on the entire surface of the wafer in a plasma-enhanced CVD system, followed by the SiNx film to form a stripe SiNx mask by a photolithographic and RIE technique, the stripe SiNx mask extending along the diffraction grating 20. Subsequently, by using the stripe SiNx mask as an etching mask, the p-InP embedding layer 21, the diffraction grating 20, the p-InP spacer layer 18, the MQW-SCH layer 16, the n-InP buffer layer 14, and the upper portion of the n-InP substrate 12 are etched to form a mesa stripe having a width of about 1.5 μm at the depth of the MQW-SCH layer 16.

With the mesa stripe formed, the p-InP layer 26 and the n-InP layer 28 are consecutively grown on both sides of the mesa stripe by a selective area growth technique using the stripe SiNx mask as a selective growth blocking mask, to form a current blocking structure having a p-n junction. After removing the stripe SiNx mask, the about-2 μm-thick adding layer 22 and the heavily doped GaInAs layer 24 are consecutively grown. The bottom surface of the n-InP substrate 12 is polished to allow the n-InP substrate 12 to have a thickness of about 120 μm. Thereafter, on top of the doped GaInAs contact layer 24, a Ti/Pt/Au multi-layer metal film is formed as the p-side electrode 30, whereas an AuGeNi film is formed as the n-side electrode 32 on the bottom surface of the n-InP substrate 12. The emitting facet of the DFB laser device 10 is coated with a non-reflection coat, and the rear facet thereof is coated with a high-reflection coat.

The DFB laser device 10 fabricated as described above revealed a threshold current of about 10 mA in operation. In addition, the DFB laser device 10 maintained a satisfactory single mode lasing with a side mode suppression ratio of 45 to 50 dB. The following exemplary experiments 1 to 6 employed DFB laser modules similar to that shown in FIG. 1, with the cavity length of the laser device changed and/or the method of bonding the laser device to the heat sink changed. In each experiment, a soldering technique was employed for the bonding the laser device 10 to the heat sink 54. For each experiment, differential resistance and thermal resistance were determined. The differential resistance was determined by measuring the V-I characteristics of the DFB laser device 10 to differentiate the voltage V with respect to the current I. The thermal resistance $R_{th}$ was determined by measuring the dependency of the emission wavelength on the injection current, then fitting the resulting measurements to the equation 1 described above.

The operating temperature of the DFB laser device 10 is measured by the resistance of a thermistor in a configuration similar to thermistor 56 in FIG. 1. To allow this measurement, the thermistor 56 is located in close proximity to the DFB laser device 10 so as to be able to measure the operating temperature of the DFB laser device 10 (52) as accurately as possible. In the experiments 1 to 6, the distance between the DFB laser device 10 and the thermistor 56 is set within 2 mm on the heat sink 54.

Experiment 1

In experiments 1 and 2, the emission injection current dependency of the emission wavelength was evaluated for different junction structures including junction-up and junction-down structures. As noted above, the junction-up or -down structure is directed to the structure of the DFB laser device being bonded onto a heat sink.

In the experiment 1, a DFB laser module having a configuration similar to that of the DFB laser module 60 shown in FIG. 1 is used, wherein the DFB laser device 10 is bonded onto the heat sink 54 in a junction-up configuration. The DFB laser device 10 used in this experiment had a cavity length of 300 μm. The sample DFB laser device 10 having the cavity length of 300 μm had a differential resistance of 5Ω. The thermal resistance was 80 K/W for the DFB laser device 10 being bonded onto the heat sink 54 in a junction-up configuration.

Figure 4:
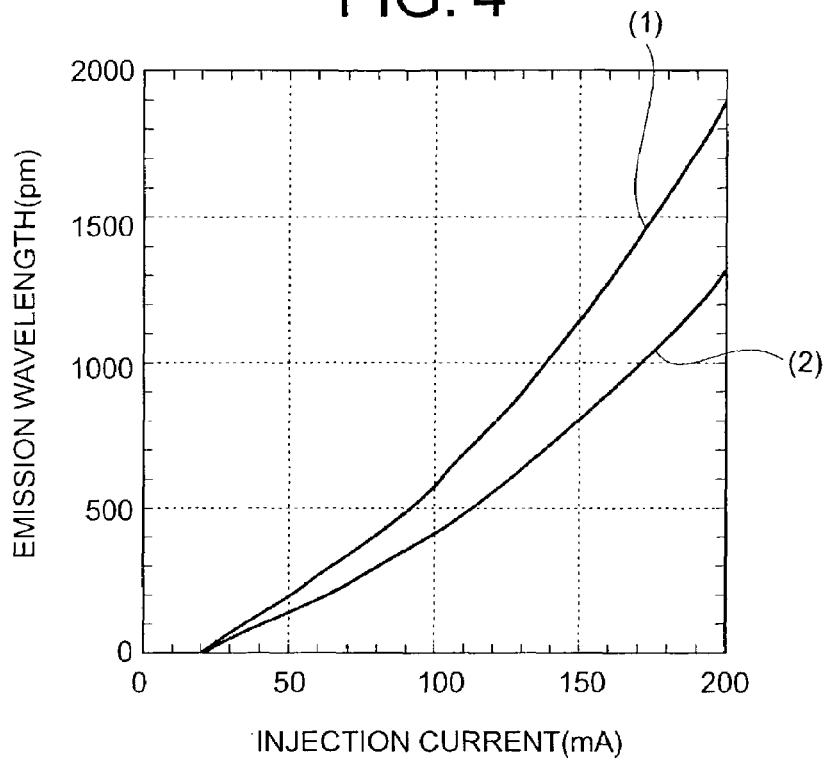
FIG. 4 is a graph showing the measured results of the relationship between the injection current and the amount of shift in the emission wavelength in the experiments 1 and 2.

Using this DFB laser module, the relationship between the injection current and the amount of shift in the emission wavelength was measured to obtain the results as shown in graph (1) of FIG. 4. For example, the emission wavelength/injection current coefficient is 10 pm/mA at an injection current of 100 mA. The wavelength/current coefficient at an injection current of 100 mA means the ratio of the change in emission wavelength to the change in the injection current at an injection current of 100 mA, that is, the ratio defined by $\Delta\lambda/\Delta I_f$ (pm/mA). It may be said that a smaller such coefficient provides a smaller variation of the emission wavelength in association with a change in the drive current.

Experiment 2

In this experiment, the DFB laser device 10, similar to that used in experiment 1, but bonded onto the heat sink 54 in a junction-down structure. This configuration revealed a thermal resistance of 55 K/W. Using this DFB laser module, the relationship between the injection current and the amount of shift in the emission wavelength was measured to obtain the results as shown in graph (2) of FIG. 4. For example, the wavelength/current coefficient is 7 pm/mA at an injection current of 100 mA.

From the comparison between the results of experiments 1 and 2, it is confirmed that the DFB lasers having similar structures and similar cavity lengths provide similar differential resistances. However, the thermal resistance provided by the laser assembly that is junction-down bonded is reduced to about 70% of that provided by the laser assembly that is junction-up bonded, whereby the wavelength/current coefficient is reduced down to 70% in the junction-down bonding.

Experiment 3

In this experiment, the DFB laser device having a cavity length of 400 μm was employed as a sample DFB laser device. The sample DFB laser device 10 had a differential resistance of 4Ω. The thermal resistance was 50 K/W for the DFB laser device 10 being bonded onto the heat sink 54 in a junction-down structure.

Figure 5:
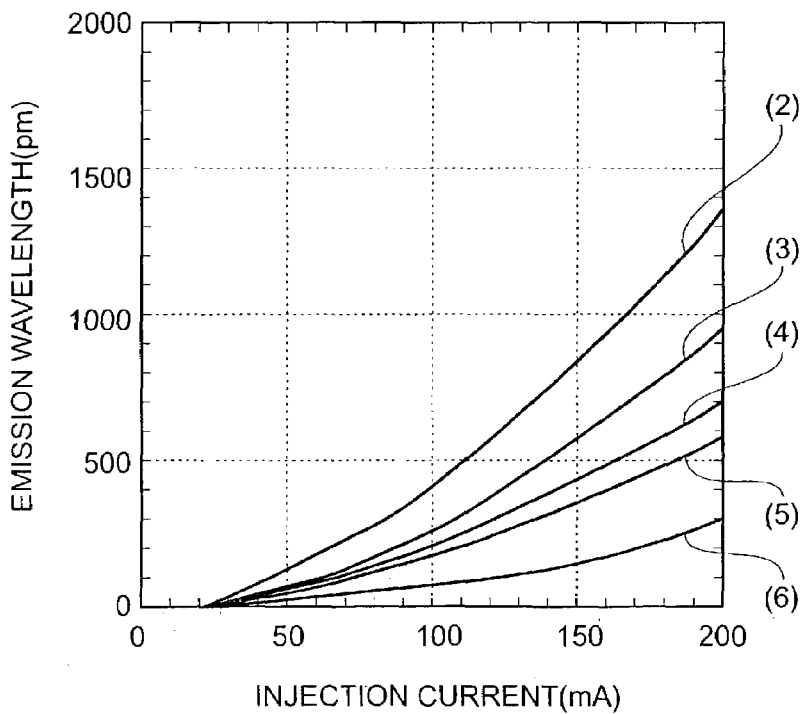
FIG. 5 is a graph showing the measured results of the relationship between the injection current and the amount of shift in the emission wavelength in experiments 2 to 5.

Using this DFB laser module, the relationship between the injection current and the amount of shift in the emission wavelength was measured to obtain the results as shown in graph (3) of FIG. 5. The wavelength/current coefficient is 5 pm/mA at an injection current of 100 mA, for example.

Experiment 4

In this experiment, the DFB laser device having a cavity length of 500 μm was employed as a sample DFB laser. The sample DFB laser device 10 had a differential resistance of 3.5Ω. The thermal resistance was 45 K/W for the DFB laser device 10 being bonded onto the heat sink 54 in a junction-down structure.

Using this DFB laser module, the relationship between the injection current and the amount of shift in the emission wavelength was measured to obtain the results as shown in graph (4) of FIG. 5. The wavelength/current coefficient was 4 pm/mA at an injection current of 100 mA, for example.

Experiment 5

In this experiment, the DFB laser device having a cavity length of 600 μm was employed as a sample DFB laser device. The sample DFB laser device 10 had a differential resistance of 3Ω. The thermal resistance was 40 K/W for the DFB laser device 10 being bonded onto the heat sink 54 in a junction-down structure.

Using this DFB laser module, the relationship between the injection current and the amount of shift in the emission wavelength was measured to obtain the results as shown in graph (5) of FIG. 5. The wavelength/current coefficient is 3 pm/mA at an injection current of 100 mA, for example.

Experiment 6

In this experiment, the DFB laser device having a cavity length of 800 μm was employed as a sample DFB laser device. The sample DFB laser device 10 had a differential resistance of 2Ω. The thermal resistance was 30 K/W for the DFB laser device 10 being bonded onto the heat sink 54 in a junction-down structure.

Using this DFB laser module, the relationship between the injection current and the amount of shift in the emission wavelength was measured to obtain the results as shown in graph (6) of FIG. 5. The wavelength/current coefficient is 2 pm/mA at an injection current of 100 mA, for example.

From the results in the experiments 2 to 6 shown in FIG. 5, it was discovered that for the junction-down bonding structure, a larger cavity length reduces the variation in the emission wavelength caused by a change in the injection current. This is because the larger cavity length of the DFB laser device reduces the differential resistance of the DFB laser device and also reduces the thermal resistance between the DFB laser device and the heat sink The conditions and results obtained in all of the exemplary experiments 1 to 6 are listed in Table 1.

TABLE 1

| Ex. NO. | Bonding Structure | Cavity length (μm) | Differential. resistance (Ω) | Thermal resistance (K/W) | Coefficient at 100 mA (pm/mA) |
|---|---|---|---|---|---|
| 1 | junction-up | 300 | 5 | 80 | 10 |
| 2 | junction-down | 300 | 5 | 55 | 7 |
| 3 | junction-down | 400 | 4 | 50 | 5 |
| 4 | junction-down | 500 | 3.5 | 45 | 4 |
| 5 | junction-down | 600 | 3 | 40 | 3 |
| 6 | junction-down | 800 | 2 | 30 | 2 |

Based on these results, the present inventor discovered that junction down bonding a relatively long cavity laser device provides the unexpected advantage of a small wavelength change per unit change of drive current.

Throughout the experiments, the inventor also observed that a smaller variation in the drive current also reduces the variation in the emission wavelength. In general, since the percent change rate in the drive current should be at a constant in the DFB laser assembly and specified from the viewpoint of reliability, a smaller value of the drive current reduces the variation itself in the drive current and thus reduces the variation in the emission wavelength. This means that using the same DFB lasers at a lower drive current or at a lower optical output power provides less variation in the emission wavelength for a specified percent increase in the drive current. It is also very important to reduce both the differential resistance and the thermal resistance of the DFB laser assembly and module when operating at a higher drive current or at a higher optical output power, because the wavelength/current coefficient increase as the operating current or the operating output power. This is shown in the quadratic curves in FIG. 5. As seen in equation 1, the wavelength/current coefficient is linearly proportional to the drive current.

It is also possible to use the wavelength/current coefficient developed by the inventor to estimate the amount of variations in the wavelength of the DFB laser assembly and the DFB laser module expected after a long-term service. For example, assume that the DFB laser module employed in experiment 5 has an initial drive current of 100 mA, which is eventually increased by 20% resulting in a drive current of 120 mA after a long-term service. In this case, the estimate wavelength variation Δλ is obtained as follows:

$$\Delta\lambda = 3 \text{ pm/mA} \times 20 \text{ mA} = 60 \text{ pm}.$$

The reduced wavelength/current coefficient can provide a significantly smaller variation in the emission wavelength.

Thus, the present invention provides a DFB laser assembly including: a DFB laser having a cavity length of 400 μm or more and a differential resistance of 4Ω or lower; and a heat sink to which the DFB laser is bonded in a junction-down structure to provide a thermal resistance of 50 K/W or less. The DFB laser has a feature that a ratio of a change in emission wavelength to a change in injection current of the operating current in operation is 5 pm/mA or less.

In an embodiment of the present invention, the DFB laser device has a cavity length of 500 μm or more and a differential resistance of 3.5Ω or lower, and is bonded onto the heat sink in a junction-down structure to have a thermal resistance of 45 K/W or less. This makes the rate of change in the emission wavelength at 4 pm/mA or less in the DFB laser device.

In another embodiment of the invention, the DFB laser has a cavity length of 600 μm or more and a differential resistance of 3Ω or lower, and is bonded onto the heat sink in a junction-down structure to have a thermal resistance of 40 K/W or less. This makes the rate of change in emission wavelength at 3 pm/mA or less.

In another embodiment of the invention, the DFB laser has a cavity length of 800 μm or more and a differential resistance of 2Ω or lower, and is bonded onto the heat sink in a junction-down structure to have a thermal resistance of 30 K/W or less. This makes the rate of change in emission wavelength at 2 pm/mA or less.

Preferably, the bonding structure employs, but not limited to, soldering as long as it provides a thermal resistance of a specific value or less.

Furthermore, the heat sink is preferably made of a material having a high thermal conductivity and a thermal expansion coefficient close to that of the constituent materials of the semiconductor laser device, such as aluminum nitride, diamond, or diamond-like carbon.

The present invention also provides a DFB laser module including: a DFB laser assembly having a DFB laser device and a heat sink bonded onto the DFB laser device, for dissipating heat energy generated in the DFB laser device; a temperature measuring device, disposed in close proximity to the DFB laser on the heat sink, for measuring the operating temperature of the DFB laser device; and a Peltier element for cooling down or heating up the DFB laser device via the heat sink to maintain the operating temperature of the DFB laser device measured by the temperature measuring device at a predetermined temperature. The DFB laser module has a feature that the DFB laser assembly is the DFB laser assembly described above and is configured to deliver a constant optical output.

In the DFB laser assembly and module of the present invention, since the wavelength/current coefficient is defined to have a specific value or less, the variation in the emission wavelength is significantly smaller even when the lasing efficiency has decreased or the threshold current has increased after a long-term service of the DFB laser assembly and module.

Now, the present invention will be described below in more detail in accordance with the preferred embodiments thereof with reference to the accompanying drawings.

First Embodiment

Referring to FIG. 6, a DFB laser assembly 50 of the present embodiment includes a buried heterostructure DFB laser device 52 having a cavity length of 400 μm and a differential resistance of 4Ω. The DFB laser assembly 50 further includes a heat sink 54 onto which the DFB laser device 52 is bonded by a soldering technique in a junction-down structure to have a thermal resistance of 50 K/W or less. A thermistor 56 is also provided to measure the operating temperature of the DFB laser device 52.

The DFB laser device 52 has a configuration similar to that of the DFB laser device 10 used as a sample in the exemplary experiments 1 to 6 as described before.

In the configuration described above, the DFB laser assembly 50 of the present embodiment provides a wavelength/current coefficient of 5 pm/mA at an operating current of 100 mA, the wavelength/current coefficient being defined by the ratio of the change in the emission wavelength to the variation in injection current causing the change in the emission wavelength.

Since the DFB laser assembly 50 of the present embodiment has a lower wavelength/current coefficient, the variation in the emission wavelength is significantly smaller even when the lasing efficiency decreases or the threshold current increases after a long-term service of the DFB laser assembly 50.

Furthermore, because of the dependency of the wavelength/current coefficient on the drive current, the DFB laser assembly 50 has an advantage of providing less variation in the emission wavelength compared with the conventional DFB laser assembly, particularly during operating at a high output power.

Second and Third Embodiments

The DFB laser assembly of the second embodiment has a configuration similar to that of the first embodiment except that the cavity length is 500 μm, the differential resistance is 3.5Ω, and the thermal resistance is 45 K/W or less in the second embodiment. The second embodiment provides a wavelength/current coefficient of 4 pm/mA at an operating current of 100 mA.

The DFB laser assembly of the third embodiment has a configuration similar to that of the first embodiment except that the cavity length is 600 μm, the differential resistance is 3Ω, and the thermal resistance is 40 K/W or less in the third embodiment. The third embodiment provides a wavelength/current coefficient of 3 pm/mA at an operating current of 100 mA.

The DFB laser assembly of the second and third embodiments provide further reduced wavelength/current coefficients compared to the DFB laser assembly of the first embodiment. Accordingly, each of the DFB laser assemblies of these embodiments provides a further reduced variation in the emission wavelength and a higher degree of wavelength stability even when the lasing efficiency decreases or the threshold current increases after a long-term service of the DFB laser assembly. In addition, each DFB laser assembly provides less variation in the emission wavelength during operating at a high output power, thereby providing a higher degree of wavelength stability.

Fourth Embodiment

The DFB laser module of the fourth embodiment has a configuration similar to that of the DFB laser module 60 shown in FIG. 2 except that the DFB laser module of the present embodiment employs any one of the DFB laser assemblies according to the first through third embodiments as a DFB laser assembly including a DFB laser device and a heat sink.

Also, the distance between the DFB laser device 52 and the thermistor 56 is within 2 mm.

The DFB laser module of the fourth embodiment employs, as a light source, a DFB laser assembly having a reduced wavelength/current coefficient. Accordingly, the variation in the emission wavelength is significantly smaller even when the lasing efficiency decreases or the threshold current increases after a long-term service of the DFB laser device.

This allows the DFB laser assembly module to be suited for use as a light source in an optical communications system.

As described above, according to the present invention, a DFB laser device having a resonant cavity is bonded onto a heat sink in a junction-down structure to reduce the thermal resistance. This makes it possible to implement a DFB laser assembly that has a reduced variation in the emission wavelength with respect to a change in the operating current and less dependency of the emission wavelength on the operating current. This also makes it possible to provide a DFB laser module that is suited for a light source in an optical communications system. The effects of the present invention become more apparent in a laser assembly operating at a high operating current or a high output power. In addition, the present invention is also applicable to a DFB laser module having a so-called wavelength locker function, which is used in optical communication systems requiring an extremely high degree of wavelength stability.

Since the above embodiments are described only for examples, the present invention is not limited to the above embodiments and various modifications or alterations can be easily made therefrom by those skilled in the art without departing from the scope of the present invention.

What is claimed is:

1. A distributed feedback semiconductor laser assembly (DFB laser assembly) comprising:
   a heat sink; and
   a DFB laser device mounted on said heat sink, wherein said DFB laser device is configured to maintain a ratio of a variation in an emission wavelength to a variation in an injection current less than or equal to 5 pm/mA.

2. The DFB laser assembly according to claim 1, wherein said DFB laser device is bonded onto said heat sink in a junction-down structure.

3. The DFB laser assembly according to claim 1, wherein said DFB laser device comprises a cavity having a length of greater than or equal to 400 μm; and
   said DFB laser is configured to provide a differential resistance less than or equal to 4Ω and a thermal resistance less than or equal to 50K/watt.

4. The DFB laser assembly according to claim 1, wherein said heat sink comprises:
   one of aluminum nitride and diamond.

5. The DFB laser assembly according to claim 1, further comprising a thermistor mounted on said heat sink, wherein
   a distance between said DFB laser device and said thermistor is less than or equal to 2 mm.

6. A laser module, comprising:
   a DFB laser assembly comprising,
      a heat sink; and
      a DFB laser device mounted on said heat sink, wherein said DFB laser device is configured to maintain a ratio of a variation in an emission wavelength and
   a variation in an injection current less than or equal to 5 pm/mA; and
   an optical system configured to optically couple the DFB laser assembly to an optical fiber.

7. The laser module according to claim 6, wherein said DFB laser device is bonded onto said heat sink in a junction-down structure.

8. The laser module according to claim 6, wherein said DFB laser device comprises a cavity having a length of greater than or equal to 400 μm; and
   said DFB laser is configured to provide a differential resistance less than or equal to 4Ω and a thermal resistance less than or equal to 50K/watt.

9. The laser module according to claim 6, wherein said heat sink comprises:
   one of aluminum nitride and diamond.

10. The laser module according to claim 6, further comprising a thermistor mounted on said heat sink, wherein
    a distance between said DFB laser device and said thermistor is less than or equal to 2 mm.

11. A distributed feedback semiconductor laser assembly (DFB laser assembly) comprising:
    a heat sink;
    a DFB laser device mounted on said heat sink, wherein said DFB laser device is configured to maintain a ratio of a variation in an emission wavelength and a variation in an injection current less than or equal to 4 pm/mA.

12. The DFB laser assembly according to claim 11, wherein
    said DFB laser device is bonded onto said heat sink in a junction-down structure.

13. The DFB laser assembly according to claim 11, wherein said DFB laser device comprises a cavity having a length of greater than or equal to 500 μm; and
    said DFB laser is configured to provide a differential resistance less than or equal to 3.5Ω and a thermal resistance less than or equal to 45K/watt.

14. The DFB laser assembly according to claim 11, wherein said heat sink comprises:
    one of aluminum nitride and diamond.

15. The DFB laser assembly according to claim 11, further comprising a thermistor mounted on said heat sink, wherein
    a distance between said DFB laser device and said heat sink is less than or equal to 2 mm.

16. A laser module comprising:
    a DFB laser assembly comprising:
       a heat sink; and
       a DFB laser device mounted on said heat sink, wherein said DFB laser device is configured to maintain a ratio of a variation in an emission wavelength and a variation in an injection current less than or equal to 4 pm/mA; and
    an optical system configured to optically couple the DFB laser assembly to an optical fiber.

17. The laser module according to claim 16, wherein
    said DFB laser device is bonded onto said heat sink in a junction-down structure.

18. The laser module according to claim 16, wherein said DFB laser device comprises a cavity having a length of greater than or equal to 500 μm; and
    said DFB laser is configured to provide a differential resistance less than or equal to 3.5Ω and a thermal resistance less than or equal to 45K/watt.

19. The laser module according to claim 16, wherein said heat sink comprises:
    one of aluminum nitride and diamond.

20. The laser module according to claim 16, further comprising a thermistor mounted on said heat sink, wherein
    a distance between said DFB laser device and said thermistor is less than or equal to 2 mm.

21. A distributed feedback semiconductor laser assembly (DFB laser assembly) comprising:
    a heat sink; and
    a DFB laser device mounted on said heat sink, wherein said DFB laser device is configured to maintain a ratio of a variation in an emission wavelength and a variation in an injection current less than or equal to 3 pm/mA.

22. The DFB laser assembly according to claim 21, wherein said DFB laser device is bonded onto said heat sink in a junction-down structure.

23. The DFB laser assembly according to claim 21, wherein said DFB laser device comprises a cavity having a length of greater than or equal to 600 μm; and
said DFB laser is configured to provide a differential resistance less than or equal to 3Ω and a thermal resistance less than or equal to 40K/watt.

24. The DFB laser assembly according to claim 21, wherein said heat sink comprises:
one of aluminum nitride and diamond.

25. The DFB laser assembly according to claim 21, further comprising a thermistor mounted on said heat sink, wherein
a distance between said DFB laser device and said thermistor is less than or equal to 2 mm.

26. A laser module comprising:
a DFB laser assembly comprising:
a heat sink; and
a DFB laser device mounted on said heat sink, wherein said DFB laser device is configured to maintain a ratio of a variation in an emission wavelength and a variation in an injection current less than or equal to 3 pm/mA; and
an optical system configured to optically couple the DFB laser assembly to an optical fiber.

27. The laser module according to claim 26, wherein
said DFB laser device is bonded onto said heat sink in a junction-down structure.

28. The laser module according to claim 26, wherein said DFB laser device comprises a cavity having a length of greater than or equal to 600 μm; and
said DFB laser is configured to provide a differential resistance less than or equal to 3Ω and a thermal resistance less than or equal to 40K/watt.

29. The laser module according to claim 26, wherein said heat sink comprises:
one of aluminum nitride and diamond.

30. The laser module according to claim 26, further comprising a thermistor mounted on said heat sink, wherein
a distance between said DFB laser device and said thermistor is less than or equal to 2 mm.

31. A distributed feedback semiconductor laser assembly (DFB laser assembly) comprising:
a heat sink; and
a DFB laser device mounted on said heat sink, wherein said DFB laser device is configured to maintain a ratio of a variation in an emission wavelength and a variation in an injection current less than or equal to 2 pm/mA.

32. The DFB laser assembly according to claim 31, wherein
said DFB laser device is bonded onto said heat sink in a junction-down structure.

33. The DFB laser assembly according to claim 31, wherein said DFB laser device comprises a cavity having a length of greater than or equal to 800 μm; and
said DFB laser is configured to provide a differential resistance less than or equal to 2Ω and a thermal resistance less than or equal to 30K/watt.

34. The DFB laser assembly according to claim 31, wherein said heat sink comprises:
one of aluminum nitride and diamond.

35. The DFB laser assembly according to claim 31, further comprising a thermistor mounted on said heat sink, wherein
a distance between said DFB laser device and said thermistor is less than or equal to 2 mm.

36. A laser module comprising:
a DFB laser assembly comprising:
a heat sink; and
a DFB laser device mounted on said heat sink, wherein said DFB laser device is configured to maintain a ratio of a variation in an emission wavelength and a variation in an injection current less than or equal to 2 pm/mA; and
an optical system configured to optically couple the DFB laser assembly to an optical fiber.

37. The laser module according to claim 36, wherein
said DFB laser device is bonded onto said heat sink in a junction-down structure.

38. The laser module according to claim 36, wherein said DFB laser device comprises a cavity having a length of greater than or equal to 800 μm; and
said DFB laser is configured to provide a differential resistance less than or equal to 2Ω and a thermal resistance less than or equal to 30K/watt.

39. The laser module according to claim 36, wherein said heat sink comprises:
one of aluminum nitride and diamond.

40. The laser module according to claim 36, further comprising a thermistor mounted on said heat sink wherein
a distance between said DFB laser device and said heat sink is less than or equal to 2 mm.

* * * * *